US012628530B2

(12) United States Patent
Wang et al.

(10) Patent No.: US 12,628,530 B2
(45) Date of Patent: May 12, 2026

(54) DISPLAY SUBSTRATE, PREPARATION METHOD THEREFOR, AND DISPLAY APPARATUS

(71) Applicant: BOE Technology Group Co., Ltd., Beijing (CN)

(72) Inventors: Pinfan Wang, Beijing (CN); Zunqing Song, Beijing (CN); Bingwei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 470 days.

(21) Appl. No.: 18/277,587

(22) PCT Filed: Oct. 31, 2022

(86) PCT No.: PCT/CN2022/128568
§ 371 (c)(1),
(2) Date: Aug. 17, 2023

(87) PCT Pub. No.: WO2024/092391
PCT Pub. Date: May 10, 2024

(65) Prior Publication Data
US 2025/0008812 A1      Jan. 2, 2025

(51) Int. Cl.
*H10K 59/80* (2023.01)
*H10K 59/12* (2023.01)
*H10K 59/122* (2023.01)

(52) U.S. Cl.
CPC ....... *H10K 59/873* (2023.02); *H10K 59/1201* (2023.02); *H10K 59/122* (2023.02)

(58) Field of Classification Search
CPC ............. H10K 59/873; H10K 59/1201; H10K 59/122; H10K 50/844; H10K 59/65; H10K 59/40; H10D 99/00
See application file for complete search history.

(56) References Cited

U.S. PATENT DOCUMENTS

2021/0367212 A1     11/2021   Kim et al.
2022/0077425 A1      3/2022   Lee et al.
(Continued)

FOREIGN PATENT DOCUMENTS

CN          111244322 A       6/2020
CN          111261693 A       6/2020
(Continued)

*Primary Examiner* — Donald L Raleigh
(74) *Attorney, Agent, or Firm* — Ling Wu; Stephen Yang; Ling and Yang Intellectual Property

(57) ABSTRACT

The present disclosure provides a display substrate and a preparation method thereof, and a display apparatus. The display substrate includes a pixel region and a stretching hole region located outside the pixel region, the stretch hole region includes a hole region and a partition region surrounding the hole region, the partition region includes a base substrate, a partition structure layer disposed on the base substrate and surrounding the hole region, an encapsulation structure layer disposed on the partition structure layer, and a sensing structure layer disposed on the encapsulation structure layer, the partition region further includes a first organic dielectric layer located between the encapsulation structure layer and the sensing structure layer, a side of the first organic dielectric layer close to the hole region covers side surfaces of sides of the partition structure layer and the encapsulation structure layer that are close to the hole region.

20 Claims, 5 Drawing Sheets

(56)         References Cited

U.S. PATENT DOCUMENTS

| 2022/0165822 | A1 | 5/2022 | Jia et al. |
| 2022/0344612 | A1 | 10/2022 | Jia et al. |
| 2023/0040100 | A1 | 2/2023 | Qin et al. |
| 2023/0172034 | A1 | 6/2023 | Li et al. |
| 2023/0389375 | A1 | 11/2023 | Zhang et al. |

FOREIGN PATENT DOCUMENTS

| CN | 111564482 | A | 8/2020 |
| CN | 112038389 | A | 12/2020 |
| CN | 113241422 | A | 8/2021 |
| CN | 113725259 | A | 11/2021 |
| CN | 215342614 | U | 12/2021 |
| CN | 114156319 | A | 3/2022 |
| WO | 2021164617 | A1 | 8/2021 |
| WO | 2022012220 | A1 | 1/2022 |

DISPLAY SUBSTRATE, PREPARATION METHOD THEREFOR, AND DISPLAY APPARATUS

CROSS-REFERENCE TO RELATED APPLICATION

The present application is a U.S. National Phase Entry of International Application No. PCT/CN2022/128568 having an international filing date of Oct. 31, 2022, the content of which is incorporated into this application by reference.

TECHNICAL FIELD

The present disclosure relates to, but is not limited to, the field of display technologies, and in particular to a display substrate, a method for preparing the display substrate, and a display apparatus.

BACKGROUND

An Organic Light Emitting Diode (OLED for short) is an active light emitting display device, which has advantages of auto-luminescence, a wide viewing angle, a high contrast ratio, low power consumption, an extremely high response speed, lightness and thinness, bendability, and a low cost, etc. With continuous development of display technologies, a flexible display that uses an OLED as a light emitting device and a Thin Film Transistor (TFT) to perform signal control has become a mainstream product in the field of display at present.

SUMMARY

The following is a summary of subject matter described herein in detail. The summary is not intended to limit the protection scope of claims.

In one aspect, the present disclosure provides a display substrate, including a pixel region and a stretching hole region located outside the pixel region, wherein the stretching hole region includes a hole region and a partition region surrounding the hole region, the partition region includes a base substrate, a partition structure layer disposed on the base substrate and surrounding the hole region, an encapsulation structure layer disposed on the partition structure layer, and a sensing structure layer disposed on the encapsulation structure layer, the partition region further includes a first organic dielectric layer located between the encapsulation structure layer and the sensing structure layer, a side of the first organic dielectric layer close to the hole region covers a side surface of a side of the partition structure layer close to the hole region and a side surface of a side of the encapsulation structure layer close to the hole region.

In an exemplary embodiment, a side surface of the side of the first organic dielectric layer close to the hole region is at least partially flush with an inner wall of the hole region.

In an exemplary embodiment, the partition region further includes a first composite insulation layer surrounding the hole region, the first composite insulation layer is located between the partition structure layer and the base substrate, and a side of the first composite insulation layer close to the hole region exposes a base substrate located around the hole region.

In an exemplary embodiment, the side of the first organic dielectric layer close to the hole region covers a side surface of the side of the first composite insulation layer close to the hole region, and the side of the first organic dielectric layer close to the hole region covers the base substrate exposed by the first composite insulation layer.

In an exemplary embodiment, the partition region further includes a second composite insulation layer surrounding the hole region, the second composite insulation layer is located between the first composite insulation layer and the partition structure layer, and a side of the second composite insulation layer close to the hole region and the side of the partition structure layer close to the hole region expose a portion of the side of the first composite insulation layer close to the hole region.

In an exemplary embodiment, the side of the first organic dielectric layer close to the hole region covers a side surface of the side of the second composite insulation layer close to the hole region and the side surface of the side of the partition structure layer close to the hole region.

In an exemplary embodiment, the partition structure layer includes a first partition layer surrounding the hole region and a second partition layer disposed on the first partition layer, a first partition hole surrounding the hole region is disposed on the first partition layer, a second partition hole surrounding the hole region is disposed on the second partition layer, and the second partition hole and the first partition hole are communicated to form a partition groove surrounding the hole region.

In an exemplary embodiment, a partial film layer of the side of the encapsulation structure layer close to the hole region covers a side surface of the side of the second composite insulation layer close to the hole region and the side surface of the side of the partition structure layer close to the hole region and extends to a partial surface of the side the first composite insulation layer close to the hole region, and the partial film layer of the side of the encapsulation structure layer close to the hole region exposes a portion of the side of the first composite insulation layer close to the hole region.

In an exemplary embodiment, the sensing structure layer includes a first conductive layer, a second conductive layer, and a second organic dielectric layer located between the first conductive layer and the second conductive layer, the second conductive layer is located at a side of the first conductive layer away from the base substrate.

In an exemplary embodiment, a side of the second organic dielectric layer close to the hole region exposes a portion of the side of the first organic dielectric layer close to the hole region.

In an exemplary embodiment, the first conductive layer includes a first sensing electrode and a shielding layer, the shielding layer is located at a side of the first sensing electrode close to the hole region, and a side surface of a side of the shielding layer close to the hole region is flush with a side surface of a side of the second organic dielectric layer close to the hole region.

In an exemplary embodiment, the second conductive layer includes a second sensing electrode, and the first sensing electrode is electrically connected with the second sensing electrode.

In an exemplary embodiment, the partition region further includes an optical structure layer disposed at a side of the sensing structure layer away from the base substrate.

In an exemplary embodiment, the partition region further includes a third organic dielectric layer, and the third organic dielectric layer is disposed between the sensing structure layer and the optical structure layer.

In an exemplary embodiment, the pixel region includes a light emitting structure layer, the light emitting structure layer includes a light emitting layer, the optical structure layer and the third organic dielectric layer cover the light emitting layer, a groove is disposed in the third organic dielectric layer, and there is an overlapping region between orthographic projections of the groove and the light emitting layer on the base substrate.

In an exemplary embodiment, a side surface of a side of the optical structure layer close to the hole region is flush with a side surface of a side of the third organic dielectric layer close to the hole region.

In an exemplary embodiment, a side of the optical structure layer close to the hole region and the side of the third organic dielectric layer close to the hole region expose a portion of a side of the second organic dielectric layer close to the hole region.

In an exemplary embodiment, the partition region further includes a protective structure layer disposed at a side of the optical structure layer away from the base substrate, a side of the protective structure layer close to the hole region covers a side surface of a side of the optical structure layer close to the hole region and a side surface of a side of the third organic dielectric layer close to the hole region.

In an exemplary embodiment, the sensing structure layer includes a first conductive layer, a second conductive layer, and a second organic dielectric layer located between the first conductive layer and the second conductive layer, the second conductive layer is located at a side of the first conductive layer away from the base substrate, and the side of the protective structure layer close to the hole region exposes a portion of a side of the second organic dielectric layer close to the hole region.

In another aspect, the present disclosure further provides a display apparatus, including the aforementioned display substrate.

In another aspect, the present disclosure also provides a method for preparing a display substrate. The display substrate includes a pixel region and a stretching hole region located outside the pixel region, the stretching hole region includes a hole region and a partition region surrounding the hole region. The method for preparing the display substrate includes: forming a partition structure layer surrounding the hole region in the partition region; forming an encapsulation structure layer disposed on the partition structure layer in the partition region; forming a first organic dielectric layer disposed on the encapsulation structure layer in the partition region; forming a sensing structure layer disposed on the first organic dielectric layer in the partition region; wherein a side of the first organic dielectric layer close to the hole region covers a side surface of a side of the partition structure layer close to the hole region and a side surface of a side of the encapsulation structure layer close to the hole region.

In an exemplary embodiment, the sensing structure layer includes a shielding layer, and forming the first organic dielectric layer disposed on the encapsulation structure layer in the partition region includes: forming a first mask layer disposed on the sensing structure layer in the partition region, and using the shielding layer as a second mask layer; removing first organic dielectric layer that is shielded by the first mask layer and the second mask layer, with a dry etching process; and removing the first mask layer and a portion of the shielding layer with a wet etching process.

Other aspects may be understood upon the drawings and detailed description are read and understood.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1:
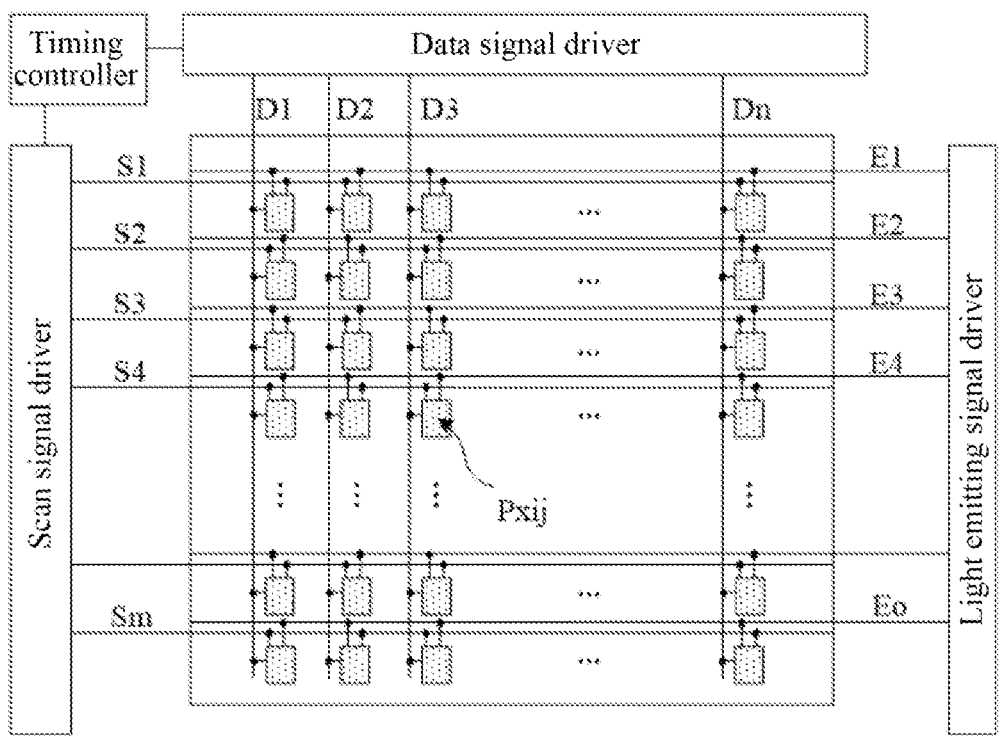
FIG. 1 is a schematic diagram of a structure of a display substrate.

To make objectives, technical solutions, and advantages of the present disclosure clearer, the embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict. In order to keep the following description of the embodiments of the present disclosure clear and concise, detailed descriptions of part of known functions and known components are omitted in the present disclosure. The drawings of the embodiments of the present disclosure only involve structures involved in the embodiments of the present disclosure, and for other structures, reference may be made to conventional designs.

In the drawings, a size of a constituent element, a thickness of a layer, or a region is exaggerated sometimes for clarity. Therefore, one implementation of the present disclosure is not necessarily limited to the dimensions, and shapes and sizes of various components in the drawings do not reflect actual scales. In addition, the drawings schematically illustrate ideal examples, and one implementation of the present disclosure is not limited to shapes, numerical values, or the like shown in the drawings.

Ordinal numerals such as "first", "second", and "third" in the specification are set to avoid confusion between constituent elements, but not set to make a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or an internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In cases that transistors with opposite polarities are used, or a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements (such as transistors), resistors, inductors, capacitors, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display apparatus. As shown in FIG. 1, an OLED display apparatus may include a timing controller, a data signal driver, a scan signal driver, a light emitting signal driver, and a pixel array. The pixel array may include multiple scan signal lines (S1 to Sm), multiple data signal lines (D1 to Dn), multiple light emitting signal lines (E1 to Eo), and multiple sub-pixels Pxij. In an exemplary implementation, the timing controller may provide the data signal driver with a gray-scale value and a control signal suitable for a specification of the data signal driver, may provide the scan signal driver with a clock signal, a scan starting signal, etc., suitable for a specification of the scan signal driver, and may provide the light emitting signal driver with a clock signal, an emission stopping signal, etc., suitable for a specification of the light emitting signal driver. The data signal driver may generate data voltages to be provided to data signal lines D1, D2, D3, . . . , and Dn using the gray-scale value and the control signal received from the timing controller. For example, the data signal driver may sample the gray-scale value using a clock signal, and apply data voltages corresponding to the gray-scale value to the data signal lines D1 to Dn by taking a pixel row as a unit, wherein n may be a natural number. The scan signal driver may generate scan signals to be provided to scan signal lines S1, S2, S3, . . . , and Sm by receiving the clock signal, the scan starting signal, etc., from the timing controller. For example, the scan signal driver may sequentially provide scan signals with on-level pulses to the scan signal lines S1 to Sm. For example, the scan signal driver may be constructed in the form of a shift register, and generate the scan signals by sequentially transmitting the scan starting signals provided in the form of on-level pulses to a next-stage circuit under the control of the clock signal, wherein m may be a natural number. The light emitting signal driver may generate emission signals to be provided to emitting signal lines E1, E2, E3, . . . , and Eo by receiving the clock signal, the emission stopping signal, etc., from the timing controller. For example, the light emitting signal driver may sequentially provide an emission signal with an off-level pulse to the light emitting signal lines E1 to Eo. For example, the light emitting signal driver may be constructed in a form of a shift register, and may generate a light emitting signal in a mode of sequentially transmitting a light emitting stopping signal provided in a form of an off-level pulse to a next-stage circuit under control of a clock signal, wherein o may be a natural number. The pixel array may include multiple sub-pixels Pxij. Each sub-pixel Pxij may be connected to the corresponding data signal line, the corresponding scan signal line, and the corresponding light emitting signal line, wherein i and j may be natural numbers. The sub-pixel Pxij may refer to a sub-pixel of which a transistor is connected to an i-th scan signal line and connected to a j-th data signal line.

At present, a flexible OLED display apparatus is uniaxially bent, and an amount of screen deformation is small. By opening micro-holes on a display substrate, a stretching performance of the display substrate can be improved. A flexible display substrate may use an island bridge structure. In the island bridge structure, light emitting devices are disposed in pixel regions, a hole region including micro-holes is disposed between pixel regions, and connection lines are disposed between the pixel regions and in connection bridge regions between hole regions. When an external force is applied to stretch the display substrate, deformation mainly occurs in hole regions and connection bridge regions, and light emitting devices in the pixel regions basically maintain their shapes, which can ensure that the light emitting devices in the pixel regions will not be damaged.

Figure 2:
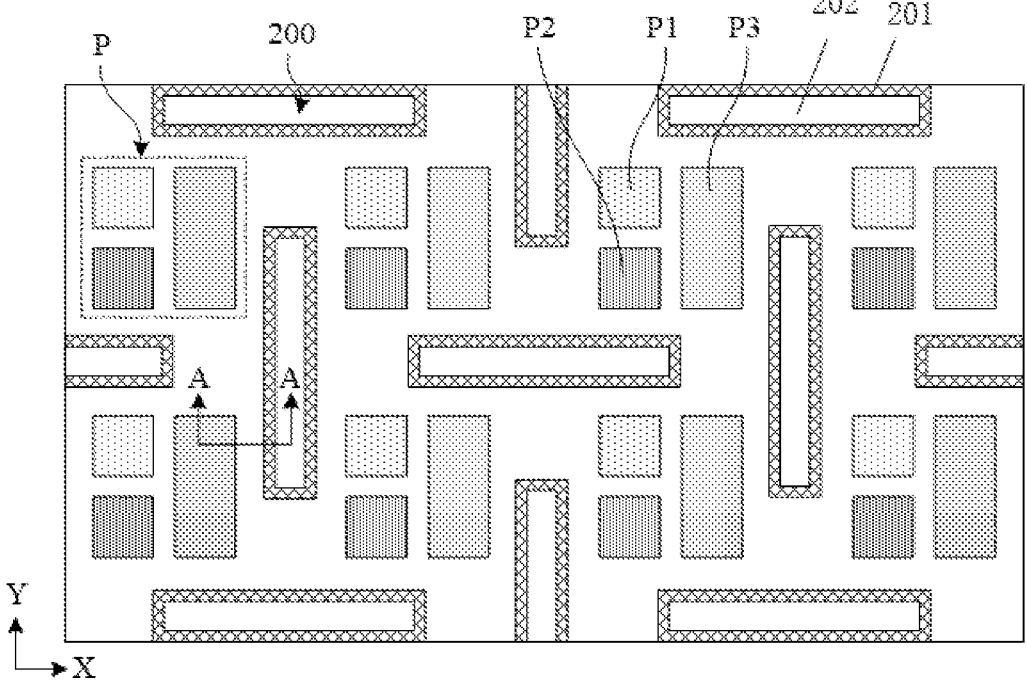
FIG. 2 is a schematic diagram of a planar structure of a display substrate.

FIG. 2 is a schematic diagram of a planar structure of a display substrate. As shown in FIG. 2, the display substrate may include multiple pixel regions disposed at intervals, wherein the multiple pixel regions may be arranged in a matrix manner. In an exemplary implementation, a pixel region may include at least one pixel unit P, the pixel unit P may include a first sub-pixel P1 that emits light of a first color, a second sub-pixel P2 that emits light of a second color, and a third sub-pixel P3 that emits light of a third color, and a sub-pixel may include a pixel drive circuit and a light emitting device. Pixel drive circuits in the first sub-pixel P1, the second sub-pixel P2, and the third sub-pixel P3 are connected with a scan signal line, a data signal line, and a light emitting signal line, respectively, and the pixel drive circuit is configured to receive a data voltage transmitted by the data signal line and output a corresponding current to the light emitting device under control of the scan signal line and the light emitting signal line. Light emitting devices in the first sub-pixel P1, the second sub-pixel P2, and the third sub-pixel P3 are connected with a pixel drive circuit of a sub-pixel where its light emitting device is located, respectively, and the light emitting device is configured to emit light with a corresponding brightness in response to a current outputted by the pixel drive circuit of the sub-pixel where the light emitting device is located.

In an exemplary implementation, the first sub-pixel P1 may be a red (R) sub-pixel, the second sub-pixel P2 may be a green (G) sub-pixel, and the third sub-pixel P3 may be a blue (B) sub-pixel. In an exemplary implementation, a pixel unit P may include four sub-pixels, such as a red sub-pixel, a green sub-pixel, a blue sub-pixel, and a white sub-pixel. In an exemplary implementation, a shape of sub-pixels in a pixel unit may be a rectangle, a rhombus, a pentagon, or a hexagon. When the pixel unit includes three sub-pixels, three light emitting units may be arranged side by side horizontally, side by side vertically, or in a mode like a Chinese character "品", and when the pixel unit includes four sub-pixels, four light emitting units may be arranged side by side horizontally, side by side vertically, or in a mode of a square, which are not limited in the present disclosure.

In an exemplary implementation, the display substrate may include multiple stretching hole regions 200 disposed at intervals, wherein a stretching hole region 200 is disposed between pixel regions, and the stretching hole region 200 is configured to increase a deformable amount of the display substrate. On a plane perpendicular to the display substrate, a base substrate and a structural film layer in the stretching hole region 200 are completely removed to form a through hole structure, or a portion of the base substrate and the structural film layer in the stretching hole region 200 is removed to form a blind hole structure. On a plane parallel to the display substrate, a shape of a stretching hole may include any one or more of the following: an "I" shape, a "T" shape, an "L" shape, and an "H" shape, which is not limited in the present disclosure.

In an exemplary implementation, the multiple stretching hole regions 200 may include a stretching hole in a first direction and a stretching hole in a second direction, wherein the stretching hole in the first direction is a strip-shaped hole extending along the first direction X, the stretching hole in the second direction is a strip-shaped hole extending along the second direction Y, and the first direction X intersects the second direction Y. In an exemplary implementation, in the first direction X, stretching holes in the first direction and stretching holes in the second direction are alternately disposed, wherein a stretching hole in the first direction is disposed between two stretching holes in the second direction, or a stretching hole in the second direction is disposed between two stretching holes in the first direction. In the second direction Y, stretching holes in the first direction and stretching holes in the second direction are alternately disposed, wherein a stretching hole in the first direction is disposed between two stretching holes in the second direction, or a stretching hole in the second direction is disposed between two stretching holes in the first direction.

Figure 3:
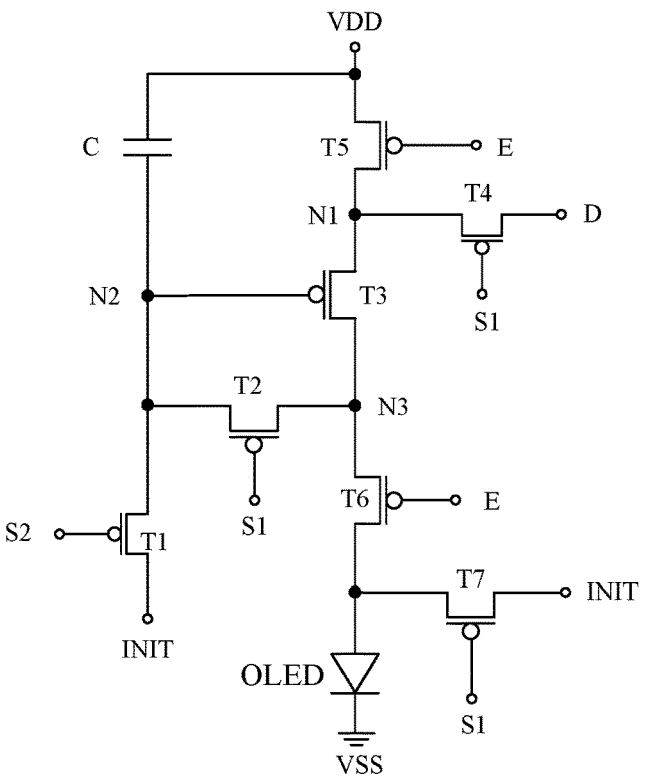
FIG. 3 is a schematic diagram of an equivalent circuit of an OLED pixel drive circuit.

In an exemplary implementation, the pixel drive circuit may be in a structure of 3T1C, 4T1C, 5T1C, 5T2C, 6T1C, 7T1C, or 8T2C, etc. FIG. 3 is a schematic diagram of an equivalent circuit of a pixel driving circuit. As shown in FIG. 3, the pixel drive circuit may include seven transistors (a first transistor T1 to a seventh transistor T7), a storage capacitor C, and seven signal lines (a first scan signal line S1, a second scan signal line S2, a light emitting signal line E, a data signal line D, an initial signal line INIT, a first power supply line VDD, and a second power supply line VSS).

In an exemplary implementation, a first terminal of the storage capacitor C is connected with a first power supply line VDD, and a second terminal of the storage capacitor C is connected with a second node N2, i.e., the second terminal of the storage capacitor C is connected with a control electrode of the third transistor T3.

A control electrode of the first transistor T1 is connected to the second scan signal line S2, a first electrode of the first transistor T1 is connected to the initial signal line INIT, and the second electrode of the first transistor is connected to the second node N2. When a scan signal with an on level is applied to the second scan signal line S2, the first transistor T1 transmits an initialization voltage to a control electrode of the third transistor T3 so that an amount of charges of the control electrode of the third transistor T3 is initialized.

A control electrode of the second transistor T2 is connected to the first scan signal line S1, a first electrode of the second transistor T2 is connected to the second node N2, and a second electrode of the second transistor T2 is connected to a third node N3. When a scan signal with an on level is applied to the first scan signal line S1, the second transistor T2 connects the control electrode of the third transistor T3 to a second electrode.

The control electrode of the third transistor T3 is connected to the second node N2, i.e., the control electrode of the third transistor T3 is connected to the second terminal of the storage capacitor C, a first electrode of the third transistor T3 is connected to the first node N1, and a second electrode of the third transistor T3 is connected to the third node N3. The third transistor T3 may be referred to as a drive transistor, and the third transistor T3 determines an amount of a drive current flowing between the first power supply line VDD and a second power supply line VSS according to a potential difference between the control electrode and a first electrode of the third transistor T3.

A control electrode of the fourth transistor T4 is connected to the first scan signal line S1, a first electrode of the fourth transistor T4 is connected to the data signal line D, and a second electrode of the fourth transistor T4 is connected to the first node N1. The fourth transistor T4 may be referred to as a switching transistor, or a scan transistor, etc., and when a scan signal with an on level is applied to the first scan signal line S1, the fourth transistor T4 causes a data voltage of the data signal line D to be inputted to the pixel drive circuit.

A control electrode of the fifth transistor T5 is connected to the light emitting signal line E, a first electrode of the fifth transistor T5 is connected to the first power supply line VDD, and a second electrode of the fifth transistor T5 is connected to the first node N1. A control electrode of the sixth transistor T6 is connected to the light emitting signal line E, a first electrode of the sixth transistor T6 is connected to the third node N3, and a second electrode of the sixth transistor T6 is connected to a first electrode of a light emitting device. The fifth transistor T5 and the sixth transistor T6 may be referred to as light emitting transistors. When a light emitting signal with an on level is applied to the light emitting signal line E, the fifth transistor T5 and the sixth transistor T6 cause the light emitting device to emit light by forming a drive current path between the first power supply line VDD and the second power supply line VSS.

A control electrode of the seventh transistor T7 is connected to the first scan signal line S1, a first electrode of the seventh transistor T7 is connected to the initial signal line INIT, and a second electrode of the seventh transistor T7 is connected to the first electrode of the light emitting device. When a scan signal with an on level is applied to the first scan signal line S1, the seventh transistor T7 transmits an initialization voltage to the first electrode of the light emitting device so as to initialize or release an amount of charges accumulated in the first electrode of the light emitting device.

In an exemplary implementation, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line of pixel drive circuits in a current display row, and the second scan signal line S2 is a scan signal line of pixel drive circuits in a previous display row, that is, for an n-th display row, the first scan signal line S1 is S(n), and the second scan signal line S2 is S(n−1). A second scan signal line S2 in the current display row and a first scan signal line S1 of the pixel drive circuits in the previous display row are a same signal line, which can reduce signal lines of the display panel, and achieve a narrow bezel of the display panel.

In an exemplary implementation, the first transistor T1 to the seventh transistor T7 may be P-type transistors, or may be N-type transistors. Use of the same type of transistors in the pixel driving circuit may simplify a process flow, reduce the process difficulty of the display panel, and improve the product yield. In some possible implementations, the first transistor T1 to the seventh transistor T7 may include P-type transistors and N-type transistors.

In an exemplary implementation, the first scan signal line S1, the second scan signal line S2, the light emitting signal line E, and the initial signal line INIT extend in a horizontal direction, and the second power supply line VSS, the first power supply line VDD, and the data signal line D extend in a vertical direction.

In an exemplary implementation, the light emitting device may be an Organic Light Emitting Diode (OLED), including a first electrode (anode), a light emitting layer, and a second electrode (cathode) that are stacked.

Figure 4:
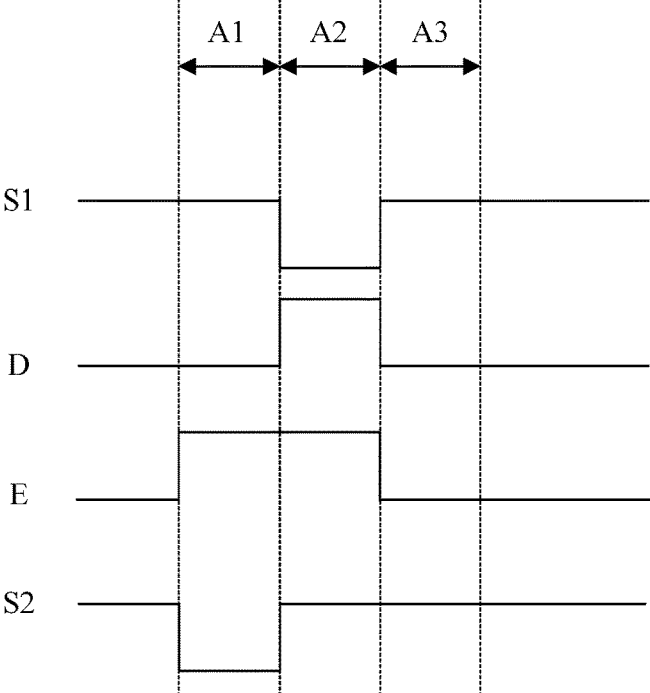
FIG. 4 is a working timing diagram of a pixel drive circuit.

FIG. 4 is a working timing diagram of a pixel drive circuit. An exemplary embodiment of the present disclosure will be described below through a working process of the pixel drive circuit illustrated in FIG. 3. The pixel drive circuit in FIG. 3 includes seven transistors (a first transistor T1 to a seventh transistor T7), one storage capacitor C, and seven signal lines (a data signal line D, a first scan signal line S1, a second scan signal line S2, a light emitting signal line E, an initial signal line INIT, a first power supply line VDD, and a second power supply line VSS), wherein all of the seven transistors are P-type transistors.

In an exemplary implementation, the working process of the pixel drive circuit may include following stages A1 to A3.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signal, so that the first transistor T1 is turned on, and a signal of the initial signal line INIT is provided to a second node N2, to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. The OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, a second terminal of the storage capacitor C is at a low level, so the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage outputted by the data signal line D is provided to a second node N2 through a first node N1, the turned-on third transistor T3, a third node N3, and the turned-on second transistor T2, and a difference between the data voltage outputted by the data signal line D and a threshold voltage of the third transistor T3 is charged into the storage capacitor C. A voltage at the second terminal (the second node N2) of the storage capacitor C is Vd−|Vth|, wherein Vd is the data voltage outputted by the data signal line D, and Vth is the threshold voltage of the third transistor T3. The seventh transistor T7 is turned on, so that an initialization voltage of the initial signal line INIT is provided to a first electrode of the OLED, to initialize (reset) the first electrode of the OLED and clear a pre-stored voltage therein, thereby completing initialization to ensure that the OLED does not emit light. The signal of the second scan signal line S2 is the high-level signal, so that the first transistor T1 is turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is a low-level signal, so that the fifth transistor T5 and the sixth transistor T6 are turned on, and a power supply voltage outputted by the first power supply line VDD provides a drive voltage to the first electrode of the OLED through the fifth transistor T5, the third transistor T3, and the sixth transistor T6 that are turned-on, to drive the OLED to emit light.

In a drive process of the pixel driving circuit, a drive current flowing through the third transistor T3 (drive transistor) is determined by a voltage difference between the gate electrode and the first electrode of the third transistor T3. Since the voltage of the second node N2 is Vdata−│Vth│, the drive current of the third transistor T3 is:

$$I = K * (Vgs - Vth)^2 = K * [(Vdd - Vd + |Vth|) - Vth]^2 = K * [(Vdd - Vd)]^2$$

Herein, I is the drive current flowing through the third transistor T3, i.e., a drive current for driving the OLED, K is a constant, Vgs is a voltage difference between the gate electrode and the first electrode of the third transistor T3, Vth is the threshold voltage of the third transistor T3, Vd is the data voltage outputted by the data signal line D, and Vdd is the power supply voltage outputted by the first power supply line VDD.

Figures 5, 6A, 6B:
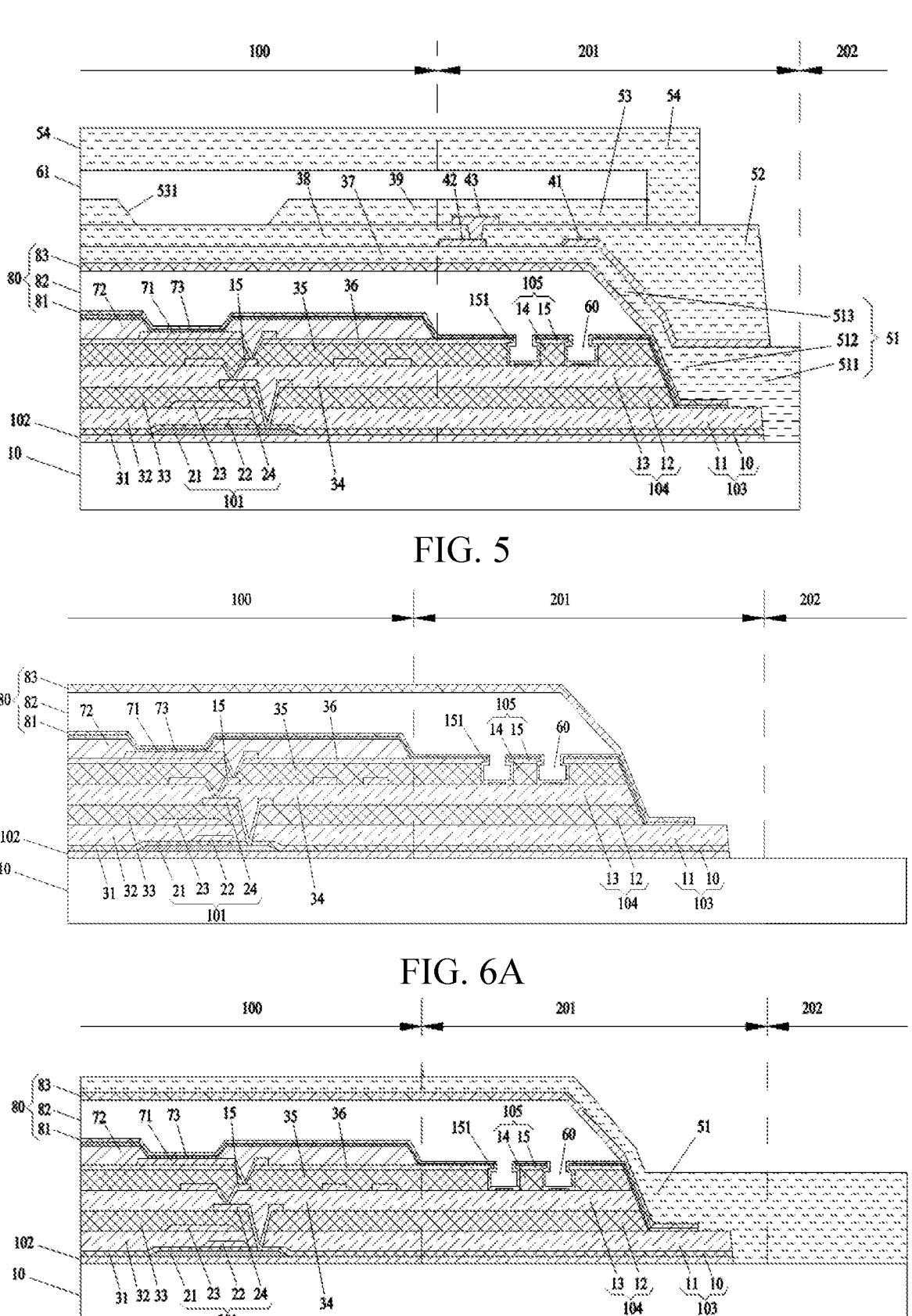
FIG. 5 is a schematic diagram of a sectional structure of a display substrate according to an exemplary embodiment of the present disclosure.
FIG. 6A is a schematic diagram of a display substrate after an encapsulation structure layer is formed according to an embodiment of the present disclosure.
FIG. 6B is a schematic diagram of a display substrate after a first organic dielectric layer is formed according to an embodiment of the present disclosure.

FIG. 5 is a schematic diagram of a sectional structure of a display substrate according to an exemplary embodiment of the present disclosure, illustrating a sectional structure at a junction of a pixel region and a stretching hole region. FIG. 5 is a sectional view taken along an A-A direction in FIG. 2. The display substrate may include a pixel region 100 and a stretching hole region 200 located outside the pixel region 100, wherein the pixel region 100 may include at least one sub-pixel, and the stretching hole region 200 may include a hole region 202 and a partition region 201 surrounding the hole region 202.

In an exemplary implementation, as shown in FIG. 5, on a plane perpendicular to the display substrate, the pixel region 100 may include a base substrate 10, a barrier layer 102 disposed on the base substrate 10, a structure layer disposed on the barrier layer 102, an encapsulation structure layer 80 disposed on the structure layer, an optical structure layer 61 disposed on the encapsulation structure layer 80, and a protective structure layer 54 disposed on the optical structure layer 61.

In an exemplary implementation, the structure layer of the pixel region 100 may include a drive structure layer disposed on the base substrate 10 and a light emitting structure layer disposed at a side of the drive structure layer away from the base substrate.

In an exemplary implementation, as shown in FIG. 5, the drive structure layer may include multiple transistors and a storage capacitor that form a pixel drive circuit, and only one transistor 101 is taken as an example in FIG. 5. As shown in FIG. 5, the transistor 101 may include an active layer 21, a first gate 22, a second gate 23, and a drain electrode 24 that are disposed on the base substrate 10. The first gate 22 is disposed at a side of the active layer 21 away from the base substrate 10. A first insulation layer 31 is disposed between the first gate 22 and the active layer 21. The second gate 23 is disposed at a side of the first gate 22 away from the base substrate 10. A second insulation layer 32 is disposed between the second gate 23 and the first gate 22. The drain electrode 24 is disposed at a side of the second gate 23 away from the base substrate 10. A third insulation layer 33 is disposed between the drain electrode 24 and the second gate 23, and the drain electrode 24 is electrically connected with the active layer 21 through a first via hole.

In an exemplary implementation, as shown in FIG. 5, the light emitting structure layer may include an anode 71, a pixel definition layer 72, a light emitting functional layer 73, and a cathode. A pixel opening is disposed in the pixel definition layer 72, the light emitting functional layer 73 is disposed in the pixel opening, and the light emitting functional layer 73 is disposed between the anode 71 and the cathode. The light emitting functional layer 73 is connected with the anode 71, the cathode is connected with the light emitting functional layer 73, and the light emitting functional layer 73 emits light of a corresponding color under drive of the anode 71 and the cathode. The anode 71 is connected with the drain electrode 24 of the transistor 101 through a connection electrode 15, a fourth insulation layer 34 is disposed between the connection electrode 15 and the drain electrode 24, a second via hole is disposed in the fourth insulation layer 34, and the connection electrode 15 is connected with the drain electrode 24 through the second via hole. A fifth insulation layer 35 and a sixth insulation layer 36 are disposed between the anode 71 and the drain electrode 24, wherein the fifth insulation layer 35 is located at a side of the sixth insulation layer 36 close to the base substrate 10.

In an exemplary implementation, the light emitting functional layer 73 may include an Emitting Layer (EML), and any one or more of the following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL).

In an exemplary implementation, as shown in FIG. 5, the encapsulation structure layer 80 of the pixel region 100 is disposed at a side of the light emitting structure layer away from the base substrate, and may include a first encapsulation layer 81, a second encapsulation layer 82, and a third encapsulation layer 83 that are stacked. The first encapsulation layer 81 and the third encapsulation layer 83 may be made of an inorganic material, and the second encapsulation layer 82 may be made of an organic material, and the second encapsulation layer 82 is disposed between the first encapsulation layer 81 and the third encapsulation layer 83, which can ensure that external vapor cannot enter into the light emitting device.

In an exemplary implementation, as shown in FIG. 5, an optical structure layer 61 of the pixel region 100 is disposed at a side of the encapsulation structure layer 80 away from the base substrate 10, and a seventh insulation layer 37, an eighth insulation layer 38, and a ninth insulation layer 39 are disposed between the optical structure layer 61 and the encapsulation structure layer.

In an exemplary implementation, the optical structure layer 61 is made of a high refractive index material, and a refractive index of the optical structure layer 61 is greater than each of refractive indices of the seventh insulation layer 37, the eighth insulation layer 38, and the ninth insulation layer 39, thereby improving light emission efficiency of the pixel region 100. The optical structure layer 61 may be formed by an ink jet printing mode or a screen printing mode. The optical structure layer 61 may include at least one of zirconium oxide, aluminum oxide, titanium oxide, or silicon oxide. For example, the refractive index of the optical structure layer 61 may be within 1.6 to 1.75, and the refractive indices of the seventh insulation layer 37, the eighth insulation layer 38, and the ninth insulation layer 39 may each be within 1.4 to 1.55.

In an exemplary implementation, as shown in FIG. 5, a groove 531 is disposed in the ninth insulation layer 39. A bottom of the groove 531 is a surface of a side of the eighth insulation layer 38 away from the base substrate 10. The groove 531 penetrates the ninth insulation layer 39 in a direction perpendicular to the display substrate. There is an overlapping region between orthographic projections of the groove 531 and the light emitting functional layer 73 in the light emitting structure layer on the base substrate 10. As an example, an orthographic projection of the groove 531 on the base substrate 10 covers an orthographic projection of the light emitting functional layer 73 in the light emitting structure layer on the base substrate 10.

In an exemplary implementation, as shown in FIG. 5, the protective structure layer 54 of the pixel region 100 is disposed on a surface of a side of the optical structure layer 61 away from the base substrate 10. The protective structure layer 54 may be made of an organic material, such as a resin.

In an exemplary implementation, as shown in FIG. 5, on a plane perpendicular to the display substrate, the partition region 201 may include a base substrate 10, a barrier layer 102 disposed on the base substrate 10, a first composite insulation layer 103 disposed on the barrier layer 102, a second composite insulation layer 104 disposed on the first composite insulation layer 103, a partition structure layer 105 disposed on the second composite insulation layer 104, an encapsulation structure layer 80 disposed on the partition structure layer 105, a sensing structure layer disposed on the encapsulation structure layer 80, an optical structure layer 61 disposed on the sensing structure layer 61, and a protective structure layer 54 disposed on the optical structure layer 61.

In an exemplary implementation, as shown in FIG. 5, the first composite insulation layer 103 surrounds the periphery of the hole region 202, and is located between the partition structure layer and the base substrate. The first composite insulation layer 103 includes a tenth insulation layer 10 disposed on the barrier layer 102 and an eleventh insulation layer 11 disposed on the tenth insulation layer 10. A side surface of a side of the tenth insulation layer 10 close to the hole region is substantially flush with a side surface of a side of the eleventh insulation layer 11 close to the hole region. A portion of a side of the first composite insulation layer 103 close to the hole region does not cover a base substrate 10 located at the periphery of the hole region, and exposes the base substrate 10 located at the periphery of the hole region. The portion of the side of the first composite insulation layer 103 close to the hole region and the exposed base substrate 10 form a first step shape.

In an exemplary implementation, as shown in FIG. 5, the tenth insulation layer 10 in the first composite insulation layer 103 and the first insulation layer 31 of the pixel region 100 are disposed in a same layer, and are formed simultaneously by a same patterning process. The eleventh insulation layer 11 in the first composite insulation layer 103 and the second insulation layer 32 of the pixel region 100 are disposed in a same layer, and are formed simultaneously by a same patterning process.

In an exemplary implementation, as shown in FIG. 5, the second composite insulation layer 104 surrounds the periphery of the hole region 202, and is located between the partition structure layer and the first composite insulation layer 103. The second composite insulation layer 104 includes a twelfth insulation layer 12 disposed on the first composite insulation layer 103 and a thirteenth insulation layer 13 disposed on the twelfth insulation layer 12. A side surface of a side of the twelfth insulation layer 12 close to the hole region is substantially flush with a side surface of a side of the thirteenth insulation layer 13 close to the hole region. A portion of a side of the second composite insulation layer 104 close to the hole region and a portion of a side of the partition structure layer 105 close to the hole region do not cover the side surface of the side of the first composite insulation layer 103 close to the hole region, and expose a portion of the side of the first composite insulation layer 103 close to the hole region.

In an exemplary implementation, as shown in FIG. 5, the twelfth insulation layer 12 in the second composite insulation layer 104 and the third insulation layer 33 of the pixel region 100 are disposed in a same layer, and are formed simultaneously by a same patterning process. The thirteenth insulation layer 13 in the second composite insulation layer 104 and the fourth insulation layer 34 of the pixel region 100 are disposed in a same layer, and are formed simultaneously by a same patterning process.

In an exemplary implementation, as shown in FIG. 5, the partition structure layer 105 surrounds the periphery of the hole region 202. The partition structure layer 105 may include a first partition layer 14 surrounding the hole region 202 and a second partition layer 15 disposed on the first partition layer 14, wherein a first partition hole surrounding a hole region 50 is disposed on the first partitioning layer 14, and a second partition hole surrounding the hole region 50 is disposed on the second partition layer 15, wherein the second partition hole and the first partition hole are communicated to form a partition groove 60 surrounding the hole region 50. In an exemplary implementation, the second partition layer 15 located at the periphery of the second partition hole has a protruding part 151 with respect to a sidewall of the first partition hole, wherein the protruding part 151 and the sidewall of the first partition hole form a recessed structure.

In an exemplary implementation, in a direction away from the hole region 50, a width of the second partition hole is less than a width of the first partition hole, and an orthographic projection of an outline of the second partition hole on the base substrate is located within a range of an orthographic projection of an outline of the first partition hole on the base substrate.

In an exemplary implementation, as shown in FIG. 5, the first partition layer 14 in the partition structure layer 105 and the fifth insulation layer 35 of the pixel region 100 are disposed in a same layer, and are formed simultaneously by a same patterning process. The second partition layer 15 in the partition structure layer 105 and the sixth insulation layer 36 of the pixel region 100 are disposed in a same layer, and are formed simultaneously by a same patterning process.

In an exemplary implementation, as shown in FIG. 5, a side surface of a side of the partition structure layer 105 close to the hole region and a side surface of a side of the second composite insulation layer 104 close to the hole region form a first plane, wherein a certain tilt angle is formed between the first plane and a plane parallel to the display substrate. A portion of the side of the partition structure layer 105 close to the hole region does not cover a side surface of the side of the first composite insulation layer 103 close to the hole region. The portion of the side of the partition structure layer 105 close to the hole region together with the second composite insulation layer 104 exposes a portion of the side of the first composite insulation layer 103 close to the hole region. A portion of the side of the partition structure layer 105 close to the hole region and a portion of the side of the second composite insulation layer 104 close to the hole region form a second step shape with the exposed first composite insulation layer 103.

In an exemplary implementation, the encapsulation structure layer 80 in the partition region 201 may include a first encapsulation layer 81, a second encapsulation layer 82, and a third encapsulation layer 83 that are stacked, wherein the first encapsulation layer 81 and the third encapsulation layer 83 may be made of an inorganic material, and the second encapsulation layer 82 may be made of an organic material. In the partition region 201, the first encapsulation layer 81 covers the partition groove 60, the second encapsulation layer 82 is disposed at a side of the first encapsulation layer 81 away from the base substrate, and fills the partition groove 60, and the third encapsulation layer 83 is disposed at a side of the second encapsulation layer 82 away from the base substrate. The first encapsulation layer 81 covering the partition structure means that the first encapsulation layer 81 covers exposed outer surfaces of the first partition layer 14 and the second partition layer 15 and covers an inner wall of the partition groove 60, to form a complete wrap for the partition groove 60.

In an exemplary implementation, as shown in FIG. 5, the encapsulation structure layer 80 in the partition region 201 and the encapsulation structure layer 80 in the pixel region 100 may be disposed in a same layer, and formed simultaneously by a same patterning process.

In an exemplary implementation, as shown in FIG. 5, a side surface of a side of the second encapsulation layer 82, close to the hole region 202, of the encapsulation structure layer 80 in the partition region 201 does not cover a side surface of a side the second composite insulation layer 104 close to the hole region 202 and a side surface of a side of the partition structure layer 105 close to the hole region 202. The side surface of the side of the second encapsulation layer 82 close to the hole region 202 forms a second plane, wherein a certain tilt angle is formed between the second plane and a plane parallel to the display substrate.

In an exemplary implementation, as shown in FIG. 5, a certain tilt angle is formed between the second plane formed by the side surface of the side of the second encapsulation layer 82 close to the hole region 202 and the first plane formed by the side surface of the side of the partition structure layer 105 close to the hole region and the side surface of the side of the second composite insulation layer 104 close to the hole region.

In an exemplary implementation, as shown in FIG. 5, the first encapsulation layer 81 and the third encapsulation layer 83 of the encapsulation structure layer 80 in the partition region 201 cover the side surface of the side of the second composite insulation layer 104 close to the hole region 202 and the side surface of the side of the partition structure layer 105 close to the hole region 202, to form a complete wrap for the side surface of the side of the second composite insulation layer 104 close to the hole region 202 and the side surface of the side of the partition structure layer 105 close to the hole region 202. A side of the first encapsulation layer 81 and the third encapsulation layer 83 close to the hole region 202 extends to a partial surface of a side of the first composite insulation layer 103 close to the hole region 202. The first encapsulation layer 81 and the third encapsulation layer 83 do not cover a side surface of the side of the first composite insulation layer 103 close to the hole region 202, and expose a portion of the side of the first composite insulation layer 103 close to the hole region 202.

In an exemplary implementation, as shown in FIG. 5, the sensing structure layer in the partition region 201 is located at a side of the encapsulation structure layer 80 away from the base substrate. A first organic dielectric layer 51 is disposed between the sensing structure layer and the encapsulation structure layer 80, wherein the first organic dielectric layer 51 can fill a segment gap between sides of the first composite insulation layer 103, the second composite insulation layer 104, and the partition structure layer 105, close to the hole region 202, and the encapsulation structure layer 80.

In an exemplary implementation, as shown in FIG. 5, a portion of a side of the first organic dielectric layer 51 close to the hole region 202 includes a first portion 511, a second portion 512, and a third portion 513 that are sequentially connected along a direction away from the hole region 202. A side surface of the first portion 511 of the first organic dielectric layer 51 is at least partially flush with an inner wall of the hole region 202 substantially. The first portion 511 of the first organic dielectric layer 51 covers the side surface of the side of the first composite insulation layer 103 close to the hole region 202, and wraps the side surface of the side of the first composite insulation layer 103 close to the hole region 202, and the first portion 511 of the first organic dielectric layer 51 covers the base substrate exposed by the first composite insulation layer, and the first portion 511 of the first organic dielectric layer 51 fills the first step shape formed by the first composite insulation layer 103 and the base substrate 10.

In an exemplary implementation, as shown in FIG. 5, the second portion 512 of the first organic dielectric layer 51 covers the side surface of the side of the second composite insulation layer 104 close to the hole region 202 and the side surface of the side of the partition structure layer 105 close to the hole region 202, and wraps the side surface of the side of the second composite insulation layer 104 close to the hole region 202 and the side surface of the side of the partition structure layer 105 close to the hole region 202. The portion of the first encapsulation layer 81 and the third encapsulation layer 83 of the encapsulation structure layer 80 that covers the side surface of the side of the second composite insulation layer 104 close to the hole region 202 and the side surface of the side of the partition structure layer 105 close to the hole region 202, is located between the side surface of the sides of the second composite insulation layer 104 and the partition structure layer 105 close to the hole region 202, and the second portion 512 of the first organic dielectric layer 51. The second portion 512 of the first organic dielectric layer 51 fills the second step shape formed by the partition structure layer 105 and the second composite insulation layer 104 and the first composite insulation layer 103.

In an exemplary implementation, as shown in FIG. 5, the third portion 513 of the first organic dielectric layer 51 covers a side surface of a side of the second encapsulation layer 82 of the encapsulation structure layer 80 close to the hole region 202.

In an exemplary implementation, as shown in FIG. 5, the third portion 513 of the first organic dielectric layer 51 and the second portion 512 of the first organic dielectric layer 51 form a third step shape.

In an exemplary implementation, as shown in FIG. 5, the first organic dielectric layer 51 and the seventh insulation layer 37 of the pixel region 100 are disposed in a same layer, and are formed simultaneously by a same patterning process.

In an exemplary implementation, as shown in FIG. 5, the sensing structure layer may include a first conductive layer, a second conductive layer, and a second organic dielectric layer 52 disposed between the first conductive layer and the second conductive layer.

In an exemplary implementation, as shown in FIG. 5, the first conductive layer is disposed at a side of the first organic dielectric layer 51 away from the base substrate, the first conductive layer includes a first sensing electrode 42 and a shielding layer 41, wherein the first sensing electrode 42 and the shielding layer 41 are both disposed on the first organic dielectric layer 51, the shielding layer 41 is located at a side of the first sensing electrode 42 close to the hole region 202, the side of the shielding layer 41 close to the hole region 202 does not cover the side surface of the first portion 511 of the first organic dielectric layer 51, and exposes a portion of the first portion 511, and a side surface of the side of the shielding layer 41 close to the hole region 202 is substantially flush with a side surface of a side of the second organic dielectric layer 52 close to the hole region. The shielding layer 41 can provide shielding for side-leaked light and reduce a segment gap. In some embodiments, the first conductive layer may not include a shielding layer, which is not repeated here in the present disclosure.

In an exemplary implementation, as shown in FIG. 5, a side of the second organic dielectric layer 52 close to the hole region does not cover a side surface of a side of the first portion 511 of the first organic dielectric layer 51 close to the hole region, and exposes a portion of the side of the first portion 511 of the first organic dielectric layer 51 close to the hole region. The side of the second organic dielectric layer 52 close to the hole region and the side of the first portion 511 of the first organic dielectric layer 51 close to the hole region form a fourth step shape.

In an exemplary implementation, as shown in FIG. 5, the side of the second organic dielectric layer 52 close to the hole region covers a side surface of a side of the third portion 513 of the first organic dielectric layer 51 close to the hole region, and the second organic dielectric layer 52 fills the third step shape formed by the third portion 513 of the first organic dielectric layer 51 and the second portion 512 of the first organic dielectric layer 51.

In an exemplary implementation, as shown in FIG. 5, the second organic dielectric layer 52 and the eighth insulation layer 38 of the pixel region 100 are disposed in a same layer, and are formed simultaneously by a same patterning process.

In an exemplary implementation, as shown in FIG. 5, the second conductive layer includes a second sensing electrode 43, wherein the second sensing electrode 43 is disposed on the second organic dielectric layer 52, and the second sensing electrode 43 is electrically connected with the first sensing electrode 42 through a via hole.

In an exemplary implementation, each of the first conductive layer and the second conductive layer may be made of a metallic material. As an example, each of the first conductive layer and the second conductive layer may be a monolayer structure of molybdenum, aluminum, titanium, or the like, or a laminated structure of titanium/aluminum/titanium, or the like.

In an exemplary implementation, as shown in FIG. 5, the optical structure layer 61 in the partition region 201 and the optical structure layer 61 in the pixel region 100 may be disposed in a same layer, and formed simultaneously by a same patterning process.

In an exemplary implementation, as shown in FIG. 5, the partition region 201 further includes a third organic dielectric layer 53 disposed between the optical structure layer 61 and the sensing structure layer. The third organic dielectric layer 53 covers the second sensing electrode 43 in the second conductive layer. A side surface of a side of the third organic dielectric layer 53 close to the hole region 202 in the partition region 201 is substantially flush with a side surface of a side of the optical structure layer 61 close to the hole region 202. A side of the third organic dielectric layer 53 close to the hole region and a side of the optical structure layer 61 close to the hole region do not cover a side surface of a side of the second organic dielectric layer 52 close to the hole region 202, and exposes a portion of the side of the second organic dielectric layer 52 close to the hole region 202. The side of the third organic dielectric layer 53 close to the hole region and the side of the optical structure layer 61 close to the hole region 202 form a fifth step shape with the side of the second organic dielectric layer 52 close to the hole region 202.

In an exemplary implementation, as shown in FIG. 5, the optical structure layer 61 and the third organic dielectric layer 53 may be located in the pixel region 100, and cover a light emitting layer in the light emitting structure layer in the pixel region 100. A groove 531, i.e. a groove 531 of the ninth insulation layer 39 in the pixel region 100, is disposed in the third organic dielectric layer 53, and there is an overlapping region between orthographic projections of the groove 531 and the light emitting layer in the light emitting structure layer on the base substrate, thereby improving a light extraction rate of the light emitting structure layer.

In an exemplary implementation, as shown in FIG. 5, the third organic dielectric layer 53 and the ninth insulation layer 39 of the pixel region 100 are disposed in a same layer, and are formed simultaneously by a same patterning process.

In an exemplary implementation, as shown in FIG. 5, the protective structure layer 54 in the partition region 201 is disposed on the optical structure layer 61. A side of the protective structure layer 54 close to the hole region covers a side surface of a side of the third organic dielectric layer 53 close to the hole region and a side surface of a side of the optical structure layer 61 close to the hole region, and wraps the side surface of the side of the third organic dielectric layer 53 close to the hole region and the side surface of the side of the optical structure layer 61 close to the hole region.

In an exemplary implementation, as shown in FIG. 5, the side of the protective structure layer 54 close to the hole region in the partition region 201 does not cover the side surface of the side of the second organic dielectric layer 52 close to the hole region, and exposes a portion of the side of the second organic dielectric layer 52 close to the hole region. The side of the protective structure layer 54 close to the hole region in the partition region 201 forms a sixth step shape with the side of the second organic dielectric layer 52 close to the hole region.

In an exemplary implementation, as shown in FIG. 5, the hole region 202 is a structure hole that penetrates the base substrate 10, the barrier layer 102, the first composite insulation layer 103, the second composite insulation layer 104, the partition structure layer 105, the encapsulation structure layer 80, the first organic dielectric layer 51, the sensing structure layer, the third organic dielectric layer 53, the optical structure layer 61, and the protective structure layer 54 in the partition region 201.

In some implementations, the hole region may be a blind hole that does not fully penetrate the base substrate.

Exemplary description is made below through a preparation process for a display substrate. "Patterning processes"

mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. "Film" refers to a layer of film formed from a certain material on a substrate using deposition, coating or other processes. If the "film" does not need to be processed through a patterning process in the entire manufacturing process, the "film" may also be called a "layer". If the "film" needs to be processed through the patterning process in the entire manufacturing process, the "film" is called a "film" before the patterning process is performed and is called a "layer" after the patterning process is performed. At least one "pattern" is contained in the "layer" which has been processed through the patterning process. "A and B are disposed on the same layer" in the present disclosure means that A and B are formed simultaneously through the running of the same patterning process, and the "thickness" of the film layer is a size of the film layer in a direction perpendicular to the display substrate. In an exemplary embodiment of the present disclosure, "an orthographic projection of B is located within a range of an orthographic projection of A" refers to that a boundary of the orthographic projection of B falls within a range of a boundary of the orthographic projection of A, or a boundary of the orthographic projection of A coincides with a boundary of the orthographic projection of B.

In an exemplary implementation, a process for preparing the display substrate may include the following operations (1) to (7).

(1) A barrier layer 102 is formed on a base substrate 10 of a partition region 201, a first composite insulation layer 103 is formed on the barrier layer 102, a second composite insulation layer 104 is formed on the first composite insulation layer 103, a partition structure layer 105 is formed on the second composite insulation layer 104, and an encapsulation structure layer 80 is formed on the partition structure layer 105. The barrier layer 102, the first composite insulation layer 103, the second composite insulation layer 104, the partition structure layer 105, and the encapsulation structure layer 80 on a hole region 202 are removed, and the base substrate 10 on the hole region 202 is retained, as shown in the FIG. 6A.

(2) A first organic dielectric layer is formed. Forming the first organic dielectric layer includes: depositing a first organic thin film on the base substrate on which the aforementioned pattern is formed, and patterning the first organic thin film by a patterning process to form a first organic dielectric layer 51 covering the encapsulation structure layer 80. A portion of a side of the first organic dielectric layer 51 close to the hole region 202 covers side surfaces of sides of the first composite insulation layer 103, the second composite insulation layer 104, and the partition structure layer 105 close to the hole region 202, and wraps the side surfaces of the sides of the first composite insulation layer 103, the second composite insulation layer 104, and the partition structure layer 105 close to the hole region 202. The first organic dielectric layer 51 covers the base substrate 10 on the hole region 202, as shown in the FIG. 6B.

(3) A sensing structure layer is formed. Forming the sensing structure layer includes: depositing a first conductive thin film on the base substrate on which the aforementioned pattern is formed, and patterning the first conductive thin film by a patterning process to form a first conductive layer. The first conductive layer includes a first sensing electrode 42 and a shielding layer 41, wherein the first sensing electrode 42 and the shielding layer 41 are both disposed on the first organic dielectric layer 51, the shielding layer 41 is located at a side of the first sensing electrode 42 close to the hole region 202, a side of the shielding layer 41 close to the hole region 202 does not cover the first organic dielectric layer 51 on the hole region 202, and the shielding layer 41 can provide shielding for side-leaked light and reduce a segment difference.

Subsequently, a second organic thin film is deposited on the first conductive layer, and the second organic thin film is patterned by a patterning process to form a second organic dielectric layer 52 covering the first sensing electrode 42 and the shielding layer 41. The second organic dielectric layer 52 covers the first organic dielectric layer 51 on the hole region 202.

Figure 6C:
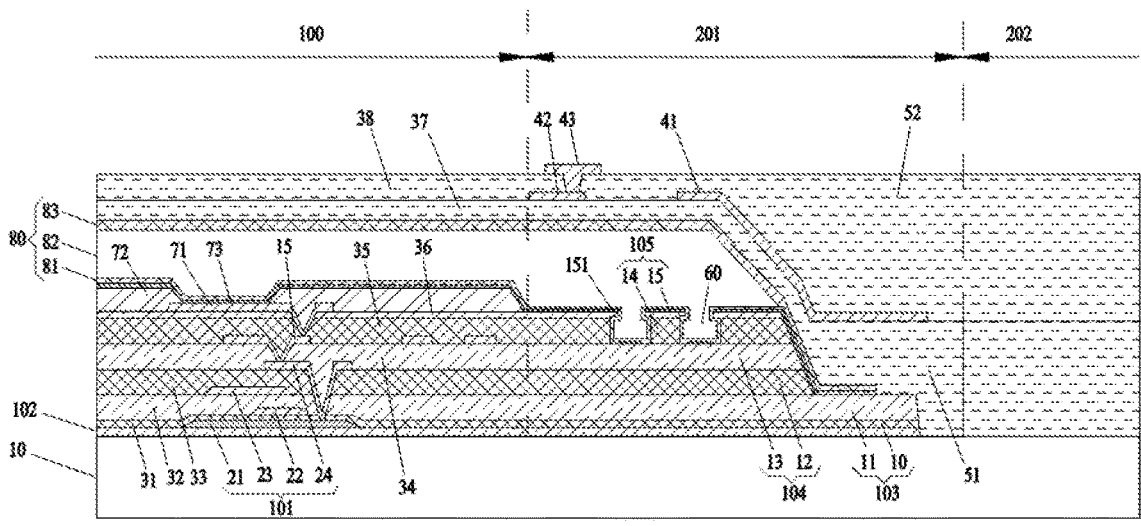
FIG. 6C is a schematic diagram of a display substrate after a sensing structure layer is formed according to an embodiment of the present disclosure.

Subsequently, the second conductive thin film is deposited on the second organic thin film, and the second conductive film is patterned by a patterning process to form a second conductive layer. The second conductive electrode layer includes a second sensing electrode 43, wherein the second sensing electrode 43 is disposed on the second organic dielectric layer 52, and the second sensing electrode 43 is electrically connected with the first sensing electrode 42 through a via hole, as shown in FIG. 6C. Herein, the first conductive layer, the second organic dielectric layer 52, and the second conductive layer form the sensing structure layer.

Figure 6D:
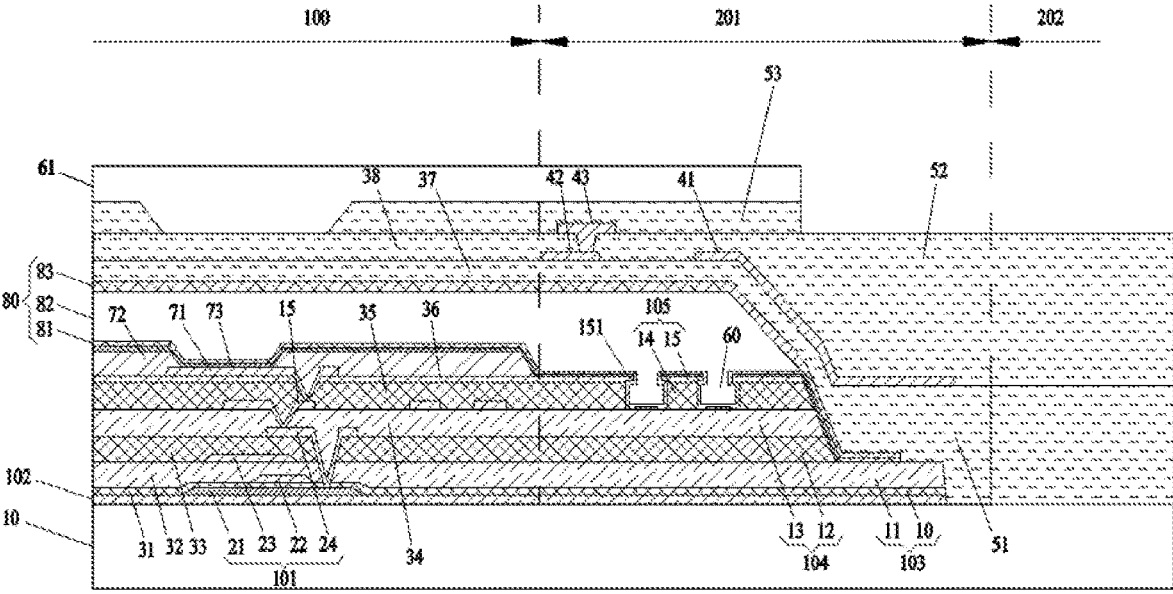
FIG. 6D is a schematic diagram of a display substrate after an optical structure layer is formed according to an embodiment of the present disclosure.

(4) An optical structure layer is formed. Forming the optical structure layer includes: depositing a third organic thin film on the base substrate on which the aforementioned pattern is formed, and patterning the third organic thin film by a patterning process to form a third organic dielectric layer 53; and then, depositing an optical thin film on the third organic dielectric layer 53, and patterning the optical thin film by a patterning process to form the optical structure layer 61, as shown in FIG. 6D.

Figure 6E:
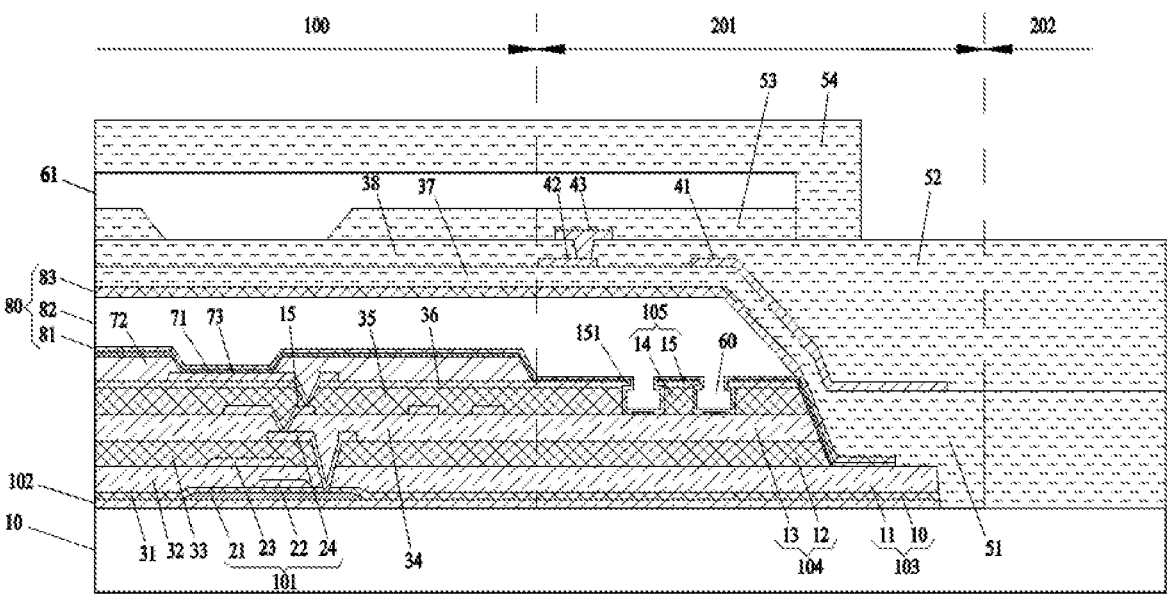
FIG. 6E is a schematic diagram of a display substrate after a protective structure layer is formed according to an embodiment of the present disclosure.

(5) A protective structure layer is formed. Forming the protective structure layer includes: depositing a fourth organic thin film on the base substrate on which the aforementioned pattern is formed, and patterning the fourth organic thin film by a patterning process to form the protective structure layer 54, wherein a side of the protective structure layer 54 close to the hole region covers a side surface of a side of the third organic dielectric layer 53 close to the hole region and a side surface of a side of the optical structure layer 61 close to the hole region, and wraps the side surface of the side of the third organic dielectric layer 53 close to the hole region and the side surface of the side of the optical structure layer 61 close to the hole region, as shown in FIG. 6E.

Figure 6F:
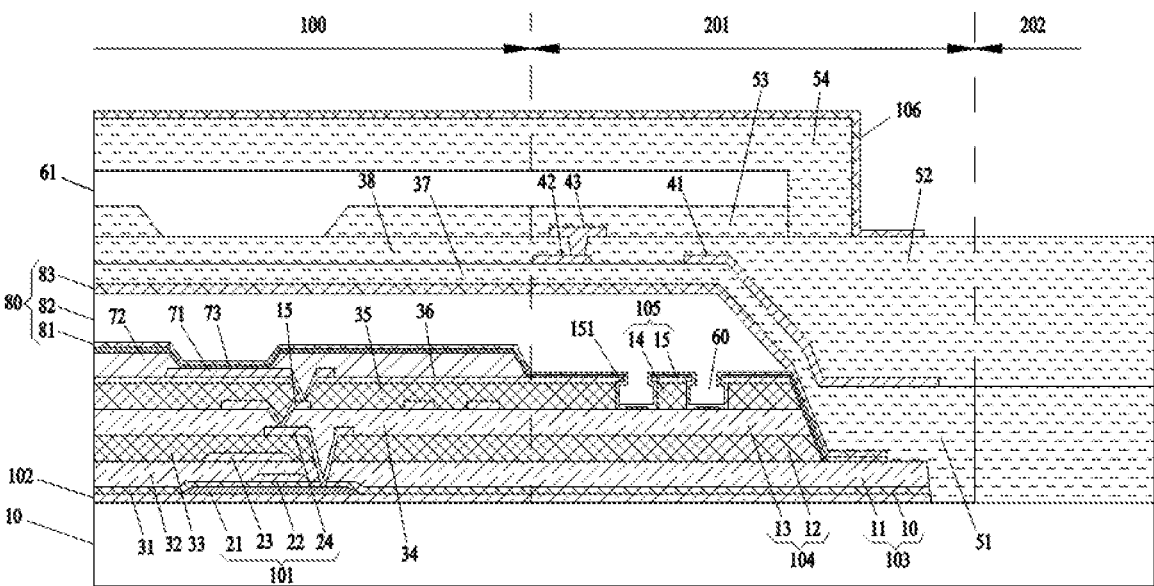
FIG. 6F is a schematic diagram of a display substrate after a first mask layer according to an embodiment of the present disclosure.

(6) A first mask layer is formed. Forming the first mask layer includes: depositing a metal thin film on the base substrate on which the aforementioned pattern is formed, and patterning the metal thin film by a patterning process to form a first mask layer 106, wherein the first mask layer 106 covers the protection structure layer 54 on the pixel region 100 and the protection structure layer 54 on the partition region 201, and a side of the first mask layer 106 in the partition region 201 close to the hole region covers a side surface of a side of the protection structure layer 54 close to the hole region, and wraps the side surface of the side of the protective structure layer 54 e close to the hole region, and the side of the first mask layer 106 close to the hole region extends to a partial surface of a side of the second organic dielectric layer 52 close to the hole region, as shown in FIG. 6F.

(7) A hole region is formed. Forming the hole region includes: on the base substrate on which the aforementioned pattern is formed, in a dry etching process, mainly with oxygen, and by shielding of the first mask layer 106 and shielding of the shielding layer 41 as a second mask layer, removing the base substrate 10, the first organic dielectric layer 51, and the second organic dielectric layer 52 on the hole region 202, removing portions of the first organic dielectric layer 51 and the second organic dielectric layer 52 that are not shielded by the first mask layer 106 and the shielding layer 41, and retaining portions of the first organic dielectric layer 51 and the second organic dielectric layer 52 that are shielded by the first mask layer 106 and the shielding layer 41, in the hole region 202; and then, in a wet etching process, removing the first mask layer 106, and removing a portion of the shielding layer 41 not shielded by the second organic dielectric layer 52, as shown in FIG. 5.

In subsequent processes, the display substrate and a glass underlay substrate may be peeled off through a laser peeling process, and then a process such as attaching a back film, cutting, or the like may be included, which is not limited here in the present disclosure.

In the display substrate on which stretching holes are disposed, a segment gap between the partition region 201 and the pixel region 100 is relatively large, which leads to a problem of a process difficulty in preparing devices such as the optical structure layer and the sensing structure layer, etc., and a requirement of a fine line width cannot be achieved. For example, in a related display substrate, a segment gap between the barrier layer on the base substrate in the partition region 201 and the encapsulation structure layer in the pixel region 100 is 5 microns to 20 microns, which increases a process difficulty in preparing devices such as the optical structure layer and the sensing structure layer, etc.

As can be seen from the structure and the preparation process of the display substrate according to the exemplary embodiments of the present disclosure, in the exemplary embodiments of the present disclosure, the segment gap between the partition region 201 and the pixel region 100 is compensated by forming the first organic dielectric layer between the encapsulation structure layer and the sensing structure layer, forming the second organic dielectric layer in the sensing structure layer, and forming the third organic dielectric layer between the optical structure layer and the sensing structure layer, thereby reducing a process difficulty of devices such as the optical structure layer and the sensing structure layer, etc., and achieving a requirement of a fine line width of devices such as the optical structure layer and the sensing structure layer, etc.

The preparation process of the display substrate in the exemplary embodiment of the present disclosure has good process compatibility, simple process achievement, easy implementation, a high production efficiency, a low production cost, and a high yield.

The structure of the display substrate and the preparation process thereof in the exemplary embodiments of the present disclosure are merely illustrative. In an exemplary implementation, a corresponding structure may be changed and patterning processes may be increased or decreased according to actual needs.

The present disclosure also provides a method for preparing a display substrate. The display substrate includes a pixel region and a stretching hole region located outside the pixel region, and the stretching hole region includes a hole region and a partition region surrounding the hole region. The method for preparing the display substrate includes: forming a partition structure layer surrounding the hole region in the partition region; forming an encapsulation structure layer disposed on the partition structure layer in the partition region; forming a first organic dielectric layer disposed on the encapsulation structure layer in the partition region; forming a sensing structure layer disposed on the first organic dielectric layer in the partition region; wherein a side of the first organic dielectric layer close to the hole region covers a side surface of a side of the partition structure layer close to the hole region and a side surface of a side of the encapsulation structure layer close to the hole region.

In an exemplary implementation, forming the encapsulation structure layer disposed on the partition structure layer in the partition region includes: forming a first mask layer disposed on the sensing structure layer in the partition region, and using the shielding layer as a second mask layer; removing the first organic dielectric layer shielded by the first mask layer and the second mask layer with a dry etching process; and removing the first mask layer and a portion of the shielding layer with a wet etching process.

The present disclosure also provides a display apparatus, including the display substrate according to the aforementioned embodiments. The display apparatus may be any product or component with a display function, such as a mobile phone, a tablet computer, a television, a display, a laptop computer, a digital photo frame, or a navigator.

Although the implementations disclosed in the present disclosure are as above, the described contents are only implementations used for convenience of understanding of the present disclosure, and are not intended to limit the present disclosure. Any one skilled in the art to which the present disclosure pertains, without departing from the spirit and scope disclosed in the present disclosure, may make any modification and change in a form and details of implementation. However, the scope of patent protection of the present application should still be subject to the scope defined by the appended claims.

The invention claimed is:

1. A display substrate, comprising a pixel region and a stretching hole region located outside the pixel region, wherein the stretching hole region comprises a hole region and a partition region surrounding the hole region, the partition region comprises a base substrate, a partition structure layer disposed on the base substrate and surrounding the hole region, an encapsulation structure layer disposed on the partition structure layer, and a sensing structure layer disposed on the encapsulation structure layer, the partition region further comprises a first organic dielectric layer located between the encapsulation structure layer and the sensing structure layer, a side of the first organic dielectric layer close to the hole region covers a side surface of a side of the partition structure layer close to the hole region and a side surface of a side of the encapsulation structure layer close to the hole region.

2. The display substrate of claim 1, wherein a side surface of the side of the first organic dielectric layer close to the hole region is at least partially flush with an inner wall of the hole region;

or the partition structure layer comprises a first partition layer surrounding the hole region and a second partition layer disposed on the first partition layer, a first partition hole surrounding the hole region is disposed on the first partition layer, a second partition hole surrounding the hole region is disposed on the second partition layer, and the second partition hole and the first partition hole are communicated to form a partition groove surrounding the hole region.

3. The display substrate of claim 1, wherein the partition region further comprises a first composite insulation layer surrounding the hole region, the first composite insulation layer is located between the partition structure layer and the base substrate, and a side of the first composite insulation layer close to the hole region exposes a base substrate located around the hole region.

4. The display substrate of claim 3, wherein the side of the first organic dielectric layer close to the hole region covers a side surface of the side of the first composite insulation layer close to the hole region, and the side of the first organic dielectric layer close to the hole region covers the base substrate exposed by the first composite insulation layer.

5. The display substrate of claim 3, wherein the partition region further comprises a second composite insulation layer surrounding the hole region, the second composite insulation layer is located between the first composite insulation layer and the partition structure layer, and a side of the second composite insulation layer close to the hole region and the side of the partition structure layer close to the hole region expose a portion of the side of the first composite insulation layer close to the hole region.

6. The display substrate of claim 5, wherein the side of the first organic dielectric layer close to the hole region covers a side surface of the side of the second composite insulation layer close to the hole region and the side surface of the side of the partition structure layer close to the hole region;

or a partial film layer of the side of the encapsulation structure layer close to the hole region covers a side surface of the side of the second composite insulation layer close to the hole region and the side surface of the side of the partition structure layer close to the hole region, and extends to a partial surface of the side of the first composite insulation layer close to the hole region, and the partial film layer of the side of the encapsulation structure layer close to the hole region exposes a portion of the side of the first composite insulation layer close to the hole region.

7. The display substrate of claim 1, wherein the sensing structure layer comprises a first conductive layer, a second conductive layer, and a second organic dielectric layer located between the first conductive layer and the second conductive layer; the second conductive layer is located at a side of the first conductive layer away from the base substrate.

8. The display substrate of claim 7, wherein a side of the second organic dielectric layer close to the hole region exposes a portion of the side of the first organic dielectric layer close to the hole region.

9. The display substrate of claim 7, wherein the first conductive layer comprises a first sensing electrode and a shielding layer; the shielding layer is located at a side of the first sensing electrode close to the hole region, and a side surface of a side of the shielding layer close to the hole region is flush with a side surface of a side of the second organic dielectric layer close to the hole region.

10. The display substrate of claim 9, wherein the second conductive layer comprises a second sensing electrode, and the first sensing electrode is electrically connected with the second sensing electrode.

11. The display substrate of claim 7, wherein the partition region further comprises an optical structure layer disposed at a side of the sensing structure layer away from the base substrate.

12. The display substrate of claim 11, wherein the partition region further comprises a third organic dielectric layer, and the third organic dielectric layer is disposed between the sensing structure layer and the optical structure layer.

13. The display substrate of claim 12, wherein the pixel region comprises a light emitting structure layer, the light emitting structure layer comprises a light emitting layer, the optical structure layer and the third organic dielectric layer cover the light emitting layer, a groove is disposed in the third organic dielectric layer, and there is an overlapping region between orthographic projections of the groove and the light emitting layer on the base substrate.

14. The display substrate of claim 12, wherein a side surface of a side of the optical structure layer close to the hole region is flush with a side surface of a side of the third organic dielectric layer close to the hole region.

15. The display substrate of claim 14, wherein the side of the optical structure layer close to the hole region and the side of the third organic dielectric layer close to the hole region expose a portion of a side of the second organic dielectric layer close to the hole region.

16. The display substrate of claim 12, wherein the partition region further comprises a protective structure layer disposed at a side of the optical structure layer away from the base substrate; a side of the protective structure layer close to the hole region covers a side surface of a side of the optical structure layer close to the hole region and a side surface of a side of the third organic dielectric layer close to the hole region.

17. The display substrate of claim 16, wherein the sensing structure layer comprises a first conductive layer, a second conductive layer, and a second organic dielectric layer located between the first conductive layer and the second conductive layer, the second conductive layer is located at a side of the first conductive layer away from the base substrate, and the side of the protective structure layer close to the hole region exposes a portion of a side of the second organic dielectric layer close to the hole region.

18. A display apparatus, comprising the display substrate according to claim 1.

19. A method for preparing a display substrate, wherein the display substrate comprises a pixel region and a stretching hole region located outside the pixel region, the stretching hole region comprises a hole region and a partition region surrounding the hole region, and the method for preparing the display substrate comprises:

forming a partition structure layer surrounding the hole region in the partition region;

forming an encapsulation structure layer disposed on the partition structure layer in the partition region;

forming a first organic dielectric layer disposed on the encapsulation structure layer in the partition region;

forming a sensing structure layer disposed on the first organic dielectric layer in the partition region;

wherein a side of the first organic dielectric layer close to the hole region covers a side surface of a side of the partition structure layer close to the hole region and a side surface of a side of the encapsulation structure layer close to the hole region.

20. The method for preparing the display substrate of claim 19, wherein the sensing structure layer comprises a shielding layer, and the forming the first organic dielectric layer disposed on the encapsulation structure layer in the partition region comprises:

forming a first mask layer disposed on the sensing structure layer in the partition region, and using the shielding layer as a second mask layer;

removing first organic dielectric layer, that is shielded by the first mask layer and the second mask layer, with a dry etching process; and removing the first mask layer and a portion of the shielding layer with a wet etching process.

\* \* \* \* \*